137-13. OR 3,528,442 SR

Sept. 15, 1970 C. J. CAMPAGNUOLO 3,528,442

FLUID MODULATOR SYSTEM

Filed July 14, 1967 2 Sheets-Sheet 1

Toug 137/13 X2351

X2457
X2505
X2470

INVENTOR,
CARL J. CAMPAGNUOLO
BY Harry M. Saragovitz
Edward J. Kelly, Herbert Berl
& J. D. Edgerton
ATTORNEYS Sept. 15, 1970 C. J. CAMPAGNUOLO 3,528,442

FLUID MODULATOR SYSTEM

Filed July 14, 1967 2 Sheets-Sheet 2

ZERO CONTROL DIFFERENTIAL

INCREASING CONTROL DIFFERENTIAL SIGNAL

INVENTOR,
CARL J. CAMPAGNUOLO

BY Harry M. Saragovitz, Edward J. Kelly, Herbert Berl & J. D. Edgerton
ATTORNEYS

United States Patent Office 3,528,442
Patented Sept. 15, 1970

3,528,442

FLUID MODULATOR SYSTEM

Carl J. Campagnuolo, Chevy Chase, Md., assignor to the United States of America as represented by the Secretary of the Army Filed July 14, 1967, Ser. No. 654,040
Int. Cl. F15c *1/12*
U.S. Cl. 137—81.5 10 Claims

ABSTRACT OF THE DISCLOSURE

A high frequency fluid modulator comprising a fluid oscillator staged with a bistable fluid amplifier is placed in series with a low frequency fluid modulator. The low frequency fluid modulator comprises a second fluid oscillator that is in turn staged with a second bistable fluid amplifier. The high frequency fluid modulator includes high impedance means to modulate its output and to amplify a low energy fluid signal. Because of the high impedance means associated with the high frequency fluid modulator the amplification of a low energy fluid signal obtained in the high frequency fluid modulator will not include amplification of the noise associated with the low energy fluid signal thus eliminating a problem long associated with prior art amplifying systems.

BACKGROUND OF THE INVENTION

This invention relates to the pure fluid arts and in particular to means for amplifying a fluid signal without amplifying the noise associated with the fluid signal.

Pure fluid systems have only recently been developed and rely upon the interchange of two or more fluids to achieve a controlled output. Fluid systems can perform logic functions analogous to those now performed by electronic circuitry. Pure fluid systems utilize no moving parts and hence are not plagued with problems of friction, wear and lubrication and are gaining widespread popularity for commercial and military applications.

In pure fluid amplifier systems it is often very important to be able to amplify an extremely low energy fluid signal without amplifying the noise associated with the signal. Prior art attempts to amplify a low energy fluid signal consisted of staging a series of proportional amplifiers. While this method was successful in amplifying the signal, the noise associated with the signal was also amplified having a harmful effect on the system. Another prior art method of amplifying a low energy fluid signal was to modulate a fluid oscillator output by the low energy fluid signal. While the signal was amplified, the noise associated with the signal was also amplified and a useable gain was difficult to obtain with this method.

Accordingly, it is an object of the present invention to provide a means to amplify a low energy fluid signal without amplifying the noise associated with said signal.

A further object of the present invention is to provide means to obtain a proportional output from a low frequency modulator in series with a high frequency modulator.

Still a further object of the present invention is to provide means to modulate a high frequency fluid signal by a low energy fluid signal and to utilize the output of the high energy fluid signal to control a low frequency fluid modulator to obtain an amplification of the low energy signal.

A further object of the present invention is to provide means to allow a high impedance, high frequency fluid modulator to be modulated by a low energy fluid signal to control a low frequency modulator, the latter to produce an amplification of the low energy fluid signal.

SUMMARY OF THE INVENTION

Briefly, in accordance with the present invention, a high frequency modulator, comprising a fluid oscillator in series with a bistable fluid amplifier, is staged with a low frequency fluid modulator. The low frequency fluid modulator consists of a second fluid oscillator in series with a second bistable fluid amplifier. High impedance means are associated with the high frequency fluid modulator to allow a low energy fluid signal to modulate the output of the high frequency fluid modulator. Since the low frequency fluid modulator is staged with the high frequency fluid modulator an amplification of the low energy fluid signal can be obtained from the low frequency fluid modulator.

DESCRIPTION OF THE PREFERRED EMBODIMENTS

Figure 1:
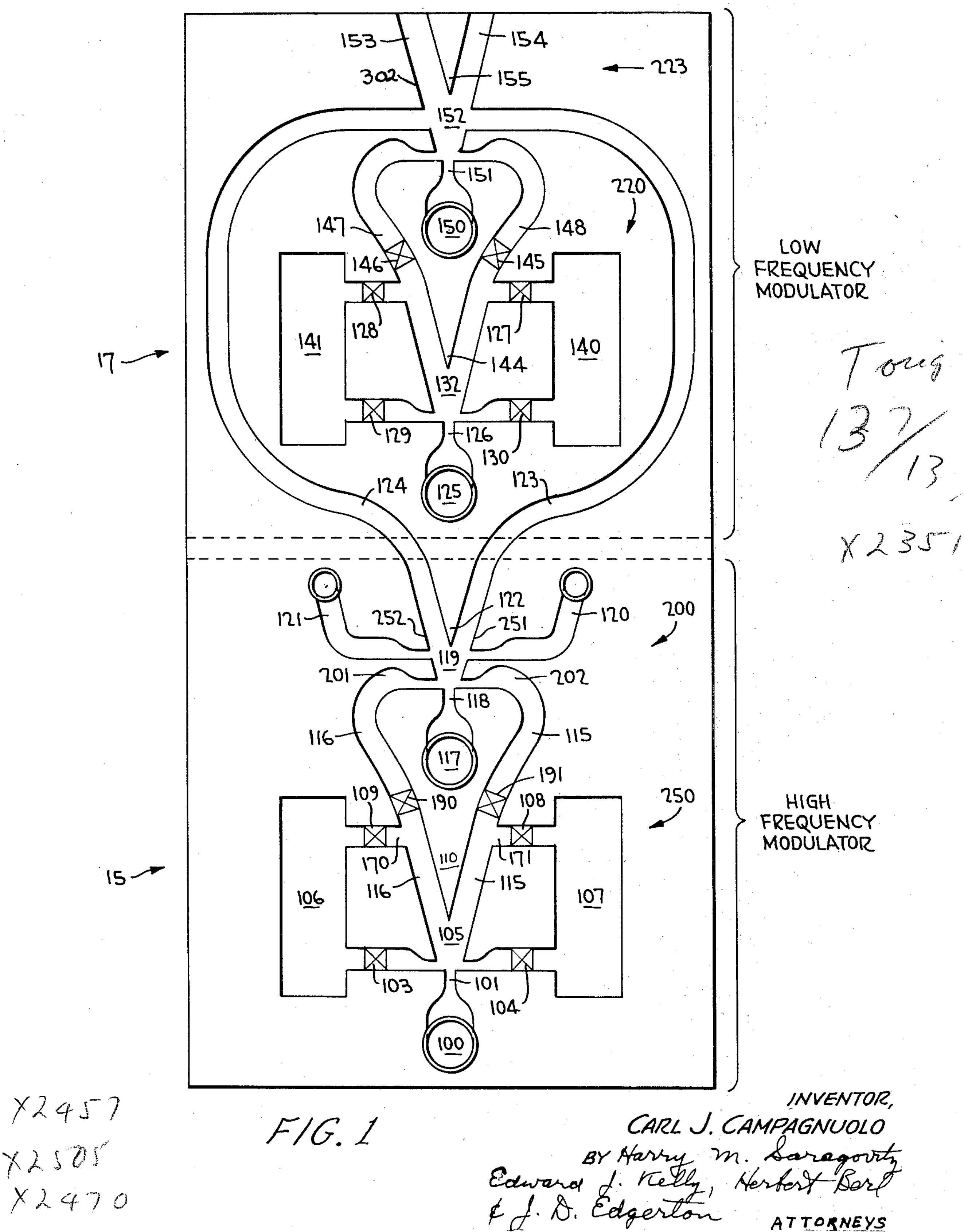
FIG. 1 is a schematic illustration of an embodiment in accordance with the present invention.

In FIG. 1 a high frequency fluid modulator 15 is shown including a relaxation fluid oscillator 250 and a digital or bistable fluid amplifier 200. A pressure source 100, by a nozzle 101, directs the pressure into interaction chamber 105 of oscillator 250. Positioned downstream of nozzle 101 is a splitter 110 which serves to define a left output passage 116 which includes a variable resistor 190 and a right output passage 115 housing a variable resistor 191. A left feedback channel 170 includes variable resistance 109, a left fluid capacitance 106 and a second variable resistance 103. A right feedback channel 171 includes a variable resistance 108, a fluid capacitance 107 and a second variable resistance 104. So far, what I have described constitutes a normal relaxation oscillator whose frequency can be determined by appropriately adjusting resistances 103 and 104. Amplifier 200 is coupled to the output conduits of the relaxation oscillator by having left output passage 116 communicate with left control 201 of amplifier 200 and right output passage 115 communicate with right control 202 of digital amplifier 200. A power source 117, preferably equal to source 100, supplies power for amplifier 200 by means of a power nozzle 118 and an interaction chamber 119. A modulating left control 121 extends through sidewall 252 and a modulating right control 120 extends through sidewall 251 allowing both controls to communicate with interaction chamber 119. A splitter 122 serves to define a left output passage 124 and a right output passage 123, both of which lead to a low frequency modulator 17. Low frequency modulator 17 includes a relaxation oscillator 220, which is identical to relaxation oscillator 250, and a digital or bistable amplifier 223. Relaxation oscillator 220 has a left output passage 147 which includes a variable resistor 146 and serves as a left control of an amplifier 223. Right output passage 148 includes a variable resistor 145 and serves as the right control of amplifier 223, the latter having a source of pressure 150 which, by power nozzle 151, directs fluid into an interaction chamber 152. A splitter 155 serves to define a left amplifier output 153 and a right amplifier output 154. As can be seen from FIG. 1, left output 124 of amplifier 200 serves to modulate the output of amplifier 223 while right output 123 of amplifier 200 similarly serves to modulate the output of amplifier 223. While it is desired that a common supply of pressure be connected to input 100 of oscillator 250 and input 117 of amplifier 200 it is not necessary that a common pressure be supplied to amplifier 223 and oscillator 220.

OPERATION OF THE INVENTION

Oscillator 250 is tuned to a frequency approximately five times that of oscillator 220 by appropriately varying resistors 103 and 104. In normal operation the frequency of oscillator 250 might be approximately 300 c.p.s. while the frequency of oscillator 220 might be approximately 60 c.p.s. High frequency modulator 15 is a high impedance device because as the fluid in oscillator 250 oscillates at a very rapid rate from output 116 to output 115 the fluid in amplifier 200 will correspondingly switch from output 124 to output 123. Due to the very high frequency of oscillator 250 part of the power output from source 117 in amplifier 200 will be directed out modulating conduits 121 and 120 alternately. As will later be described this will provide the high impedance characteristics for high frequency modulator 15. If no signal is applied to either modulating conduit 121 or 120 part of the fluid from source 117 will be directed to the respective modulating conduits with the majority of the fluid being alternately directed to output conduits 124 and 123. Oscillator 220 will direct an alternating stream of fluid to amplifier 223 which, with the alternating pulses of fluid directed to the amplifier from bistable amplifier 200, will direct the power fluid from source 150 to oscillate about splitter 155 and direct equal pulses of fluid to output conduits 153 and 154. If it is desired to amplify a low energy fluid signal, the signal is directed to modulating conduits 121 and 120. Because of the very high frequency of oscillator 250 part of the fluid from source 117 will be alternately directed to conduit 121 and conduit 120 as the fluid oscillates from sidewall 252 to 251. If a low energy signal is connected to either modulating conduits 121 or 120 it will serve to stop the fluid directed to the modulating conduit from nozzle 118 from exhausting through the modulating conduit and direct the fluid in the modulating conduit to back up towards interaction chamber 119 where it will direct the power fluid from jet 118 to the sidewall furthest from the modulating conduit which receives the low energy fluid signal. For purposes of illustration let us assume a signal is applied to left modulating conduit 121. This signal will tend to block the fluid in conduit 121 directed there by the oscillating power stream from nozzle 118 and cause the fluid from the oscillating power stream in conduit 121 to back up towards interaction chamber 119 and bias the power jet from nozzle 118 to right output 123. The result of this will be that the fluid from nozzle 118 will oscillate from right sidewall 251 to a position short of left sidewall 252 so that there will be a continuous pressure pulse having a minimal value above zero in passage 123 and alternating pulse in passage 124 having a lower mean value than that in passage 123. Oscillator 220 will direct alternating equal pulses to amplifier 223 which will oscillate fluid from power nozzle 151 to output passages 153 and 154. If the pressure pulses in passages 123 and 124 are equal, equal pulses will be directed out passages 153 and 154 of amplifier 223. If the pressure pulse in passage 123 is pulsed at a positive value above zero while the pressure in passage 124 is pulsed about a zero value, passage 153 will be pulsed about a positive value above zero and the output in passage 154 will be pulsed about a zero value. It can be seen that if a stronger signal is applied to secondary control of modulating control 121 a more positive pulse will be received in passage 123 resulting in a more positive pulse in passage 153. Due to the very high frequency of oscillator 250 in comparison to the frequency of oscillator 220 if no signal were applied to either of modulating conduits 121 or 120 the power jet issuing from nozzle 151 of amplifier 223 will oscillate about splitter 155 and not between the sidewalls that define interaction chamber 152. Thus it can be seen that by varying the pressure in secondary or modulating control conduits 121 and 120 a proportional pulsed output is obtainable in the output passages of bistable amplifier 223. Using this system as shown in FIG. 1 and applying a signal at modulating control conduits 121 and 120, a proportional gain over 100 has been obtained in output passages 153 and 154.

The reason that my system does not amplify the noise in the low energy fluid signal that is applied to conduits 121 and 120 is that each of these conduits has high impedance characteristics because part of the jet from 118 that is oscillated from sidewall 252 to 251 is directed out each of the respective conduits. Therefore, when a signal is applied to either of conduits 121 or 120 the signal does not enter the interaction chamber with the associated noise but merely acts as a blockage means and causes the fluid that is directed to either of the modulating conduits to be blocked by the low energy control signal and to back up to interaction chamber 119 to modulate the output of oscillator 250 and amplifier 200.

Figure 2:
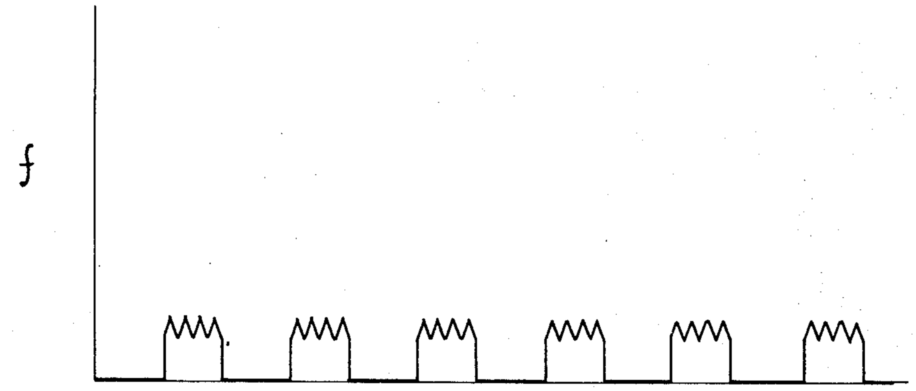
FIG. 2 is a plot of the frequency ($f$) for a zero control signal applied to the embodiment of FIG. 1.
Figure 3:
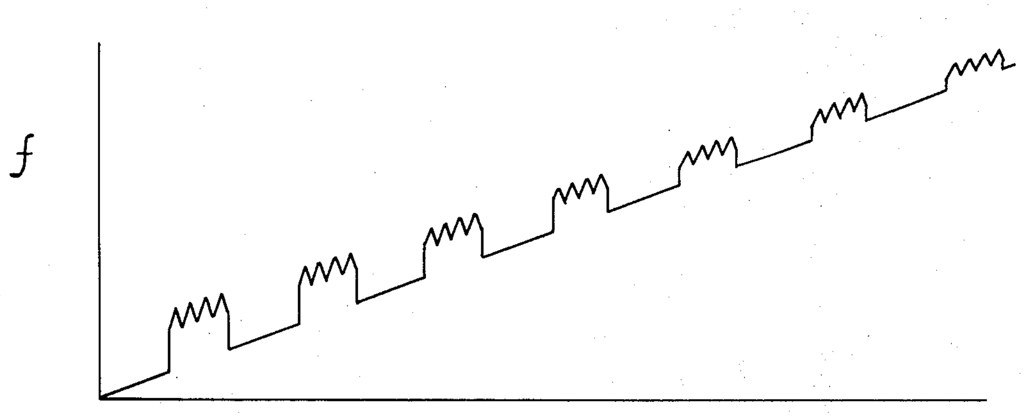
FIG. 3 is a plot of the frequency for an increasing control differential signal applied to the embodiment of FIG. 1.

In FIG. 2 I have shown graphically the frequency of the output in passage 153 with no differential control pressure applied to controls 120 and 121. As can be seen from the graph there will be a square carrier wave representing the frequency of oscillator 220 with a modulating wave impressed thereon representing the frequency of oscillator 250. The wave is square since the fluid from oscillator 250 is at a high frequency and directed to bistable amplifier 200 so that the power fluid from nozzle 151 in amplifier 223 oscillates about splitter 155 and not the sidewalls that define interaction chamber 152. If a positive signal is supplied to control 121 there will be a positive signal in conduit 123 which will tend to cause the oscillating stream from nozzle 151 to oscillate about a point slightly to the left of splitter 155 with the result as shown in FIG. 3. As the signal to conduit 121 increases the fluid from nozzle 151 will oscillate closer and closer to left sidewall 302 of amplifier 223 with a decrease of pulsing in conduit 154, since nearly all the output from nozzle 151 will be in conduit 153. When the signal from 121 is of sufficient strength the fluid from conduit 151 will be adjacent to sidewall 302 with all the output in passage 153. Thus it can be seen that as the signal to conduit 121 is increased the carrier wave fluctuation in conduit 153 will be decreased, as seen in FIG. 3, since the fluid will not be oscillating about splitter 155 but to a position to the left thereof. When the fluid in amplifier 223 is adjacent sidewall 302 there will be no fluctuations in the output of passage 153 since all the fluid will be directed there and the graph in FIG. 3, if extended to show this condition, would be a straight line.

Thus it will be apparent that I have designed a novel means which can be utilized to amplify a low energy fluid signal without amplifying a noise associated with the signal to obtain a gain of approximately 100.

I wish it to be understood that I do not desire to be limited to the exact details of construction shown and described, for obvious modifications will occur to a person skilled in the art.

I claim:

1. A fluid system comprising:
   (a) a first fluid modulator having a first oscillating output signal,
   (b) a second fluid modulator including a digital amplifier in series with a fluid oscillator,
   (c) said second fluid modulator in series with said first fluid modulator, and
   (d) high impedance means associated with said first fluid modulator to modulate its oscillating output signal.

2. A device according to claim 1 wherein said second fluid modulator includes a second fluid oscillator having a frequency lower than said first fluid oscillator and a second digital fluid amplifier in series with said second fluid oscillator.

3. A device according to claim 2 wherein:

(a) said first fluid oscillator of said first fluid modulator has a pair of output conduits and a power source, (b) said first fluid amplifier of said first fluid modulator includes a power source, a pair of output conduits, a pair of control conduits to selectively direct said amplifier power source to said amplifier power output conduits, and (c) said first oscillator output conduits are communicated to said first fluid amplifier control conduits.

4. A device according to claim 3 wherein said means associated with said first fluid modulator to modulate its output comprise a pair of modulating conduits associated with said first fluid amplifier to modulate said first amplifier power source between its output conduits.

5. A device according to claim 4 wherein:

(a) said second fluid oscillator of said second fluid modulator has a power source, a pair of output conduits, and means to alternately direct its power source between said output conduits, (b) said second fluid amplifier has a power source, a pair of output conduits, and a pair of control conduits to control said power source of said second fluid amplifier between said output conduits, and (c) said output conduits of second fluid oscillator of said second fluid modulator are communicated to said control conduits of said second bistable fluid amplifier.

6. A device according to claim 5 wherein said second fluid amplifier of said second fluid modulator has an interaction chamber defined by first and second sidewalls, said pair of control conduits of said second fluid amplifier of said first fluid modulator extends through said first and said second sidewalls, respectively, and said output passages of said first fluid amplifier of said first fluid modulator extends through said first and said second sidewalls of said second fluid amplifier of said second fluid modulator, respectively.

7. A device according to claim 6 wherein the frequency of said first fluid oscillator of said first fluid modulator is approximately five times larger than the frequency of said second fluid oscillator of said second fluid modulator.

8. A device according to claim 7 wherein said power source for said first fluid oscillator and said first bistable fluid amplifier of said high frequency fluid modulator are common.

9. A method of amplifying a low energy signal without amplifying the noise associated with said signal comprising the steps of:

(a) producing a first oscillating signal, (b) amplifying said first oscillating signal to produce a first amplified signal, (c) applying said low energy signal to said first amplified signal to produce a first modulated signal, (d) producing a second oscillating signal, (e) amplifying said second oscillating signal to produce a second amplified signal, (f) applying said first modulated to said second amplified signal to produce an output signal, whereby said output signal is directly proportional to said low energy signal.

10. The method of claim 9 wherein the frequency of said first oscillating signal is approximately five times greater than the frequency of said second oscillating signal.

References Cited

UNITED STATES PATENTS

| | | | |
|---|---|---|---|
| 3,425,430 | 2/1969 | Horton | 137—81.5 |
| 3,434,487 | 3/1969 | Bauer | 137—81.5 |
| 3,117,593 | 1/1964 | Somers | 137—81.5 XR |
| 3,185,166 | 5/1965 | Horton et al. | 137—81.5 |
| 3,199,782 | 8/1965 | Shinn | 137—81.5 XR |
| 3,223,101 | 12/1965 | Bowles | 137—81.5 |
| 3,228,410 | 1/1966 | Warren et al. | 137—81.5 |
| 3,285,264 | 11/1966 | Boothe | 137—81.5 |
| 3,348,562 | 10/1967 | Ogren | 137—81.5 |
| 3,398,758 | 8/1968 | Unfried | 137—81.5 |
| 3,399,688 | 9/1968 | Westerman | 137—81.5 |

SAMUEL SCOTT, Primary Examiner